(12) United States Patent
Arai et al.

(10) Patent No.: US 8,075,788 B2
(45) Date of Patent: Dec. 13, 2011

(54) FABRICATION METHOD OF PRINTED CIRCUIT BOARD AND PRINTED CIRCUIT BOARD MACHINING APPARATUS

(75) Inventors: Kunio Arai, Ebina (JP); Hiroshi Aoyama, Ebina (JP); Yasuhiko Kanaya, Ebina (JP)

(73) Assignee: Hitachiviamechanics, Ltd., Kanagawa (JP)

( * ) Notice: Subject to any disclaimer, the term of this patent is extended or adjusted under 35 U.S.C. 154(b) by 1040 days.

(21) Appl. No.: 11/987,980

(22) Filed: Dec. 6, 2007

(65) Prior Publication Data

US 2008/0283491 A1    Nov. 20, 2008

(30) Foreign Application Priority Data

Dec. 6, 2006  (JP) .................................. 2006-330046

(51) Int. Cl.
*H05K 3/06* (2006.01)
(52) U.S. Cl. ................ 216/13; 216/11; 216/18; 216/38; 216/49; 216/52; 29/846
(58) Field of Classification Search ......................... None
See application file for complete search history.

(56) References Cited

U.S. PATENT DOCUMENTS

| | | | |
|---|---|---|---|
| 6,240,636 B1* | 6/2001 | Asai et al. ........................ | 29/852 |
| 7,761,982 B2* | 7/2010 | Nagase et al. ................... | 29/832 |
| 2005/0056931 A1* | 3/2005 | Ogawa ........................... | 257/728 |
| 2006/0057341 A1* | 3/2006 | Kawabata et al. ............. | 428/209 |
| 2007/0148420 A1* | 6/2007 | Salama et al. ................ | 428/209 |
| 2008/0052904 A1* | 3/2008 | Schneider et al. .............. | 29/846 |
| 2008/0149379 A1* | 6/2008 | Nagase et al. ................ | 174/260 |

* cited by examiner

*Primary Examiner* — Anita Alanko
(74) *Attorney, Agent, or Firm* — Wenderoth, Lind & Ponack, L.L.P.

(57) ABSTRACT

A printed circuit board fabrication method allows a fabrication time and a fabrication cost to be reduced. The fabrication method of the printed circuit board includes steps of forming a resist layer on a surface of the printed circuit board whose surface is made of an insulator, of forming a hole that is connected from the surface of the resist layer to a conductor pattern of an inner layer and a hole and grooves having a depth not connected with the conductor layer of the inner layer by irradiating lasers, of filling a conductive material into the holes and the grooves to form a conductor pattern and of removing the resist layer to project a portion of the conductor pattern out of the surface of the insulating layer.

14 Claims, 8 Drawing Sheets

FIG.1A
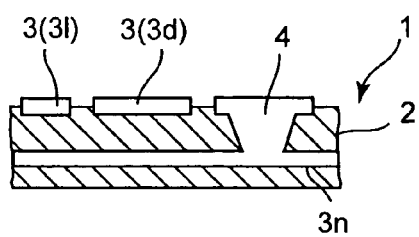
FIG.1B
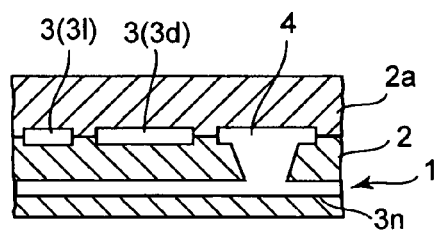
FIG.1C
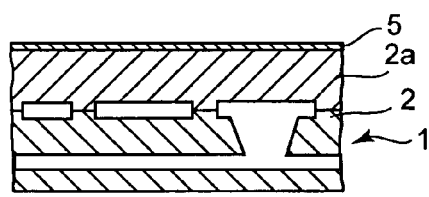
FIG.1D
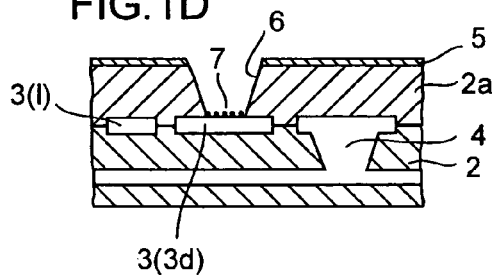
FIG.1E
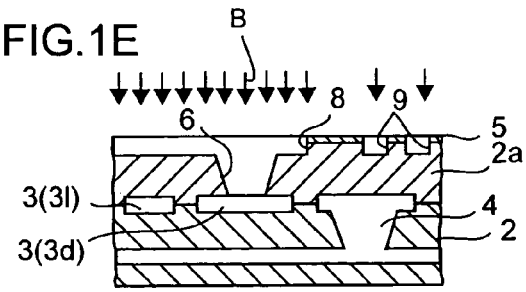
FIG.1F
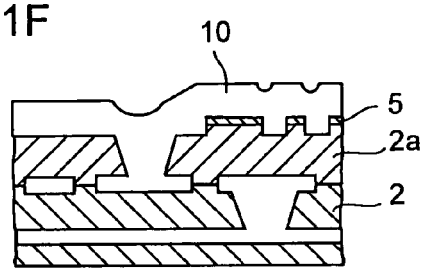
FIG.1G
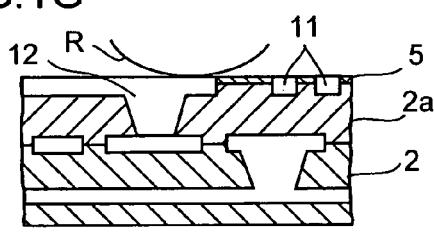
FIG.1H
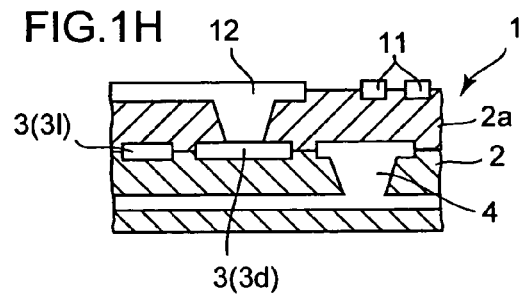

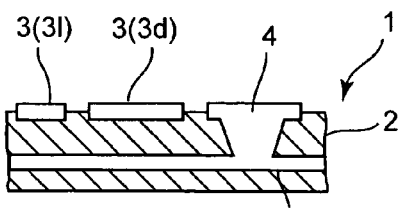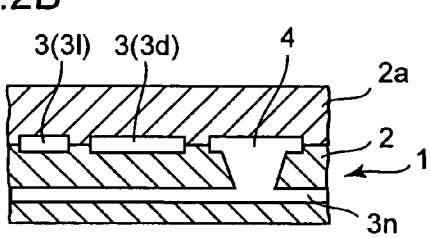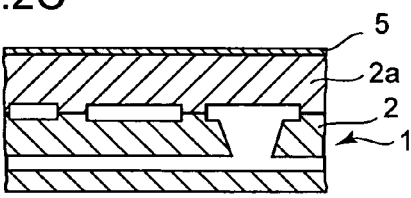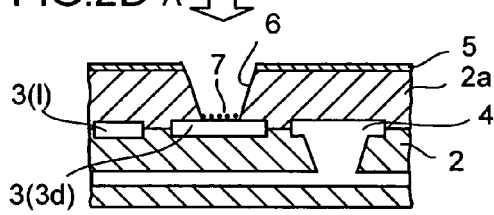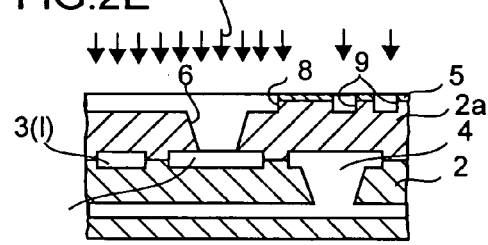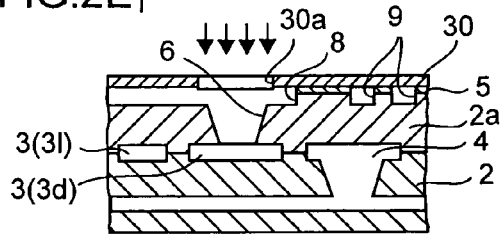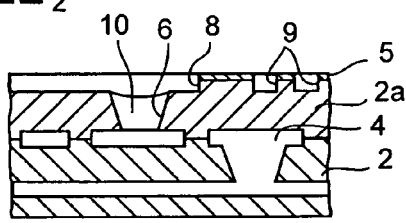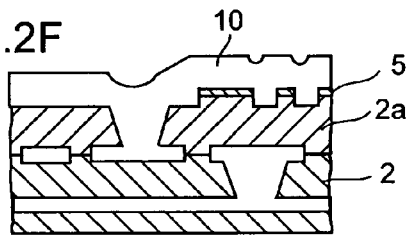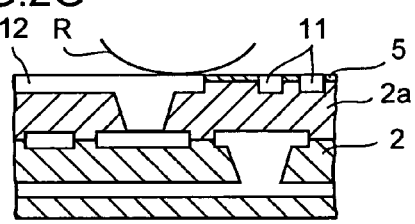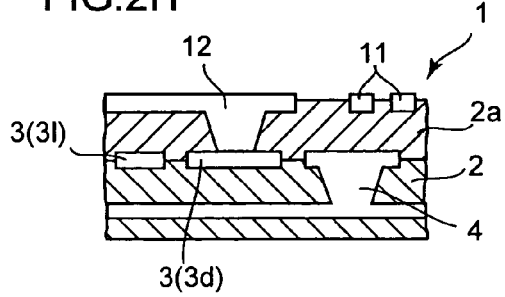

FIG. 3A
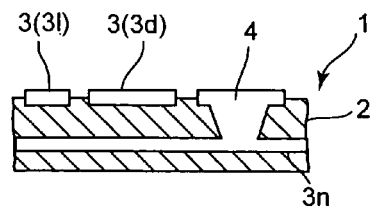
FIG. 3B
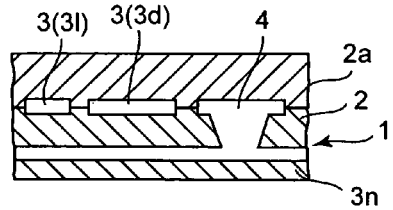
FIG. 3C
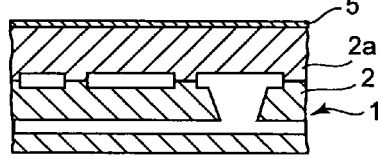
FIG. 3D
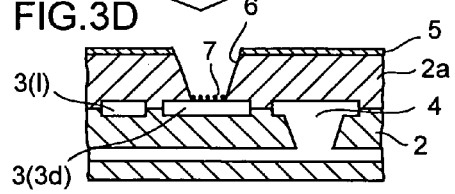
FIG. 3E
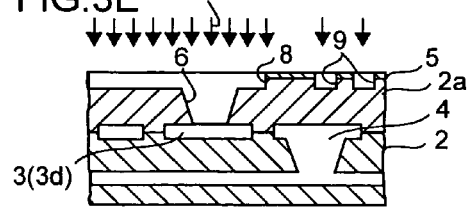
FIG. 3E$_1$
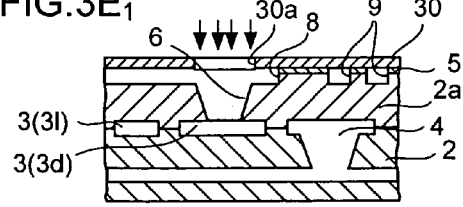
FIG. 3E$_2$
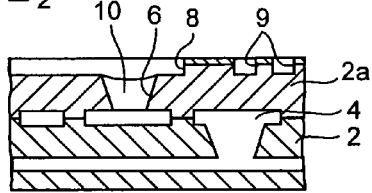
FIG. 3E$_3$
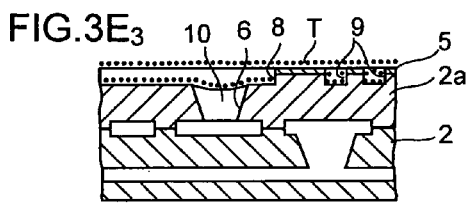
FIG. 3F
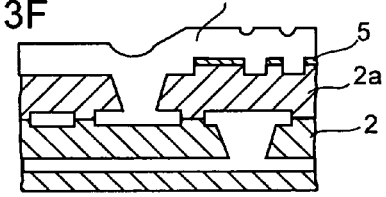
FIG. 3G
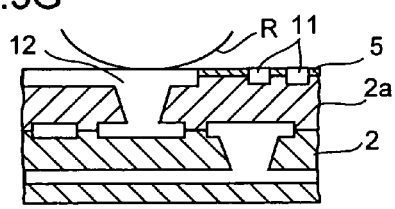
FIG. 3H
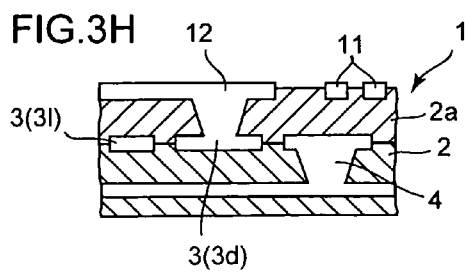

FIG.4A
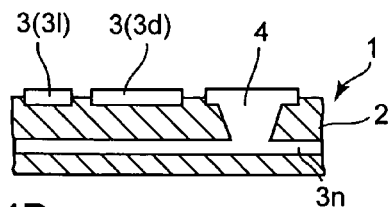
FIG.4B
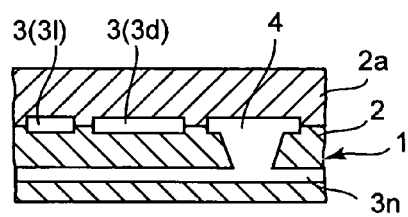
FIG.4C
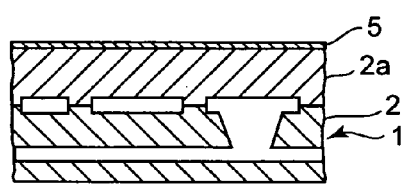
FIG.4D
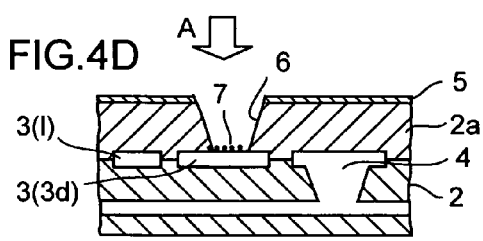
FIG.4E
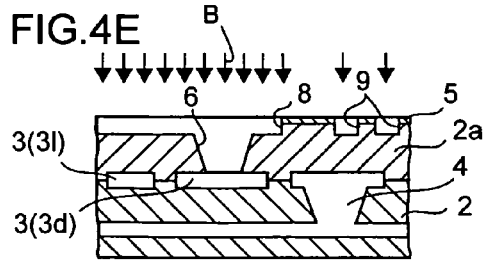
FIG.4E₁
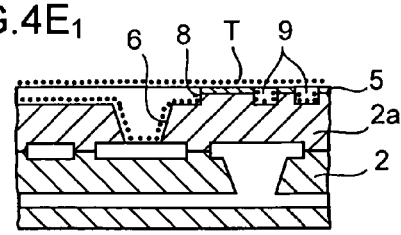
FIG.4F
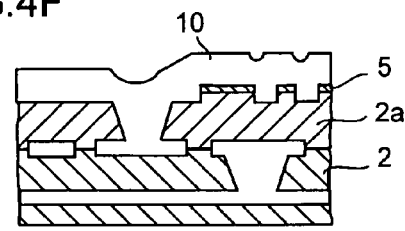
FIG.4G
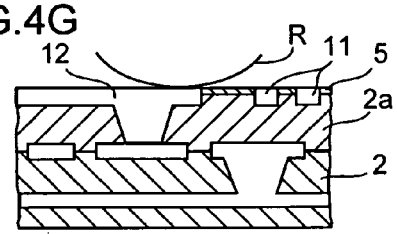
FIG.4H
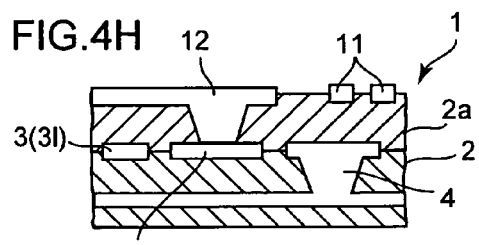

FABRICATION METHOD OF PRINTED CIRCUIT BOARD AND PRINTED CIRCUIT BOARD MACHINING APPARATUS

BACKGROUND OF THE INVENTION

1. Field of the Invention

The present invention relates to a fabrication method of a printed circuit board and to a printed circuit board machining apparatus.

2. Description of Related Art

Japanese Patent Application Laid-open No. 2006-41029 has been known as a method for fabricating a printed circuit board having very fine wires. It discloses a method of forming grooves corresponding to a conductor pattern (wiring pattern) on a surface insulating layer of the printed circuit board, depositing a conductor (precursor of the wiring pattern) to the formed grooves and then removing the excessive conductor from the surface side of the printed circuit board. A through hole for connecting a conductor pattern in an inner layer with the conductor pattern formed on the surface is made by laser in case of this technology prior to forming the grooves corresponding to the conductor pattern. This technology allows the printed circuit board having the smooth surface to be formed.

A trial for fabricating a conductor pattern by using an excimer laser whose sectional shape (called as "beam shape" hereinafter) is shaped into a rectangular shape has being carried out as disclosed in Phil Rumsby et. al., Proc. SPIE Vol. 3184, pp. 176-185, 1997.

A technology of forming a blind hole by means of an excimer laser whose beam is shaped into a rectangular shape by using a surface conductor layer as a mask has been also known as disclosed in Japanese Patent Application Laid-open No. Hei. 7-336055.

However, in case of JP Application Laid-open No. 2006-41029, it requires at least (a) a photo-resist application step, (b) a photo-resist curing step, (c) an exposure step, (d) a developing step, and (e) a soft-etching step as processes for forming the grooves. Still more, because almost all of the conductor pattern except for a part of the through hole is in a state of just being placed flatly on the insulating layer, its peel strength is weak.

Furthermore, Phil Rumsby et. al. have not considered means for connecting the conductor pattern of the inner layer with the conductor pattern formed on the surface.

Accordingly, it is an object of the invention to provide a printed circuit board whose peel strength is strong as well as to provide a fabrication method and a printed circuit board machining apparatus for fabricating a printed circuit board that allow a fabrication time to be shortened and a fabrication cost to be reduced.

BRIEF SUMMARY OF THE INVENTION

In order to solve the aforementioned problem, according to a first aspect of the invention, a method for fabricating a printed circuit board includes a resist layer forming step of forming a resist layer on a surface of a printed circuit board having a conductor layer as an inner layer and whose surface is an insulating layer, a hole forming step of forming a hole reaching to the conductor layer of the inner layer from the surface of the resist layer at first position set in advance by irradiating a first laser beam from the surface side of the resist layer, a recess forming step of forming recesses having a depth not connected to the conductor layer of the inner layer from the surface of the resist layer at second position set in advance by irradiating a second laser to the second position, a conductor filling step of forming a conductor pattern by filling a conductive material into the recesses and a resist layer removing step of removing the resist layer to project portions of the conductor pattern out of the surface of the insulating layer. It is noted that the aforementioned "recess" of the invention is a broad concept including the holes and grooves.

Furthermore, according to a second aspect of the invention, a method for fabricating a printed circuit board includes a resist layer forming step of forming a resist layer on a surface of a printed circuit board having a conductor layer as an inner layer and whose surface is an insulating layer, a recess forming step of forming recesses having a depth not connected to the conductor layer of the inner layer from the surface of the resist layer at the first position and second position set in advance by irradiating second laser to the first and second positions, a hole forming step of forming a hole reaching to the conductor layer of the inner layer from the surface of the resist layer at the first position by irradiating a first or second laser beam from the surface side of the resist layer, a conductor filling step of forming a conductor pattern by filling a conductive material into the hole and recesses and a resist layer removing step of removing the resist layer to project portions of the conductor pattern out of the surface of the insulating layer. It is noted that the aforementioned "recess" of the invention is a broad concept including the holes and grooves.

In the first and second aspects described above, the conductive material existing above the surface of the resist layer may be removed after disposing the conductive material on the hole, the recess and the surface of the resist layer in filling the conductive material in the conductor filling step. In this case, the conductive material may be filled into the hole and the recess in the conductor filling step by means of sputtering. Furthermore, in case of filling the conductive material into the hole and the recess in the conductor filling step by means of plating, it is preferable to dispose a conductor of 1 µm or less thick on the surface of the hole and the recess prior to plating.

Still more, the first laser may be a $CO_2$ laser or a UV laser whose wavelength is 400 nm or less and the second laser may be an excimer laser in the first and second aspects described above.

Furthermore, a section of the second laser orthogonal to a center axis thereof may be substantially rectangular whose one side is fully larger than another side in the first and second aspects described above.

According to a third aspect of the invention, a printed circuit board machining apparatus has a laser oscillator for outputting a first laser beam, a laser oscillator for outputting a second laser beam, a first optical system for shaping the first laser beam into a laser beam whose section is circular, a positioning unit for positioning the sectionally-circular beam and the sectionally-rectangular beam in X- and Y-directions, a second optical system for shaping the second laser beam into a laser beam whose section is rectangular, a moving unit for moving a mask disposed on an optical path of the sectionally-rectangular beam in a direction orthogonal to the optical path and a table movable in the Y-direction while carrying a workpiece, wherein the printed circuit board machining apparatus is arranged so as to be able to irradiate the sectionally-circular beam and the sectionally-rectangular beam to the workpiece.

According to the invention, the conductor pattern projecting out of the insulating layer provided in advance bites into another insulating layer formed thereon, so that peel strength that holds the preceding insulator together with the following insulator so that they do not peel off increases by interposing the conductor pattern and reliability as the printed circuit board increases. Still more, the method of the invention allows a number of processing steps to be reduced as compared to the prior art technologies, so that it becomes possible to reduce a fabrication time and to lower a fabrication cost.

BRIEF DESCRIPTION OF DRAWINGS

FIGS. 1A, 1B, 1C, 1D, 1E, 1F, 1G and 1H are diagrams for explaining a procedure for fabricating a multi-layered printed circuit board according to an embodiment of the invention;

FIGS. 2A, 2B, 2C, 2D, 2E, $2E_1$, $2E_2$, 2F, 2G and 2H are diagrams for explaining a first modification of the invention;

FIGS. 3A, 3B, 3C, 3D, 3E, $3E_1$, $3E_2$, $3E_3$, 3F, 3G and 3H are diagrams for explaining a second modification of the invention;

FIGS. 4A, 4B, 4C, 4D, 4E, $4E_1$, 4F, 4G and 4H are diagrams for explaining a third modification of the invention;

DETAILED DESCRIPTION OF THE INVENTION

Figure 5A:
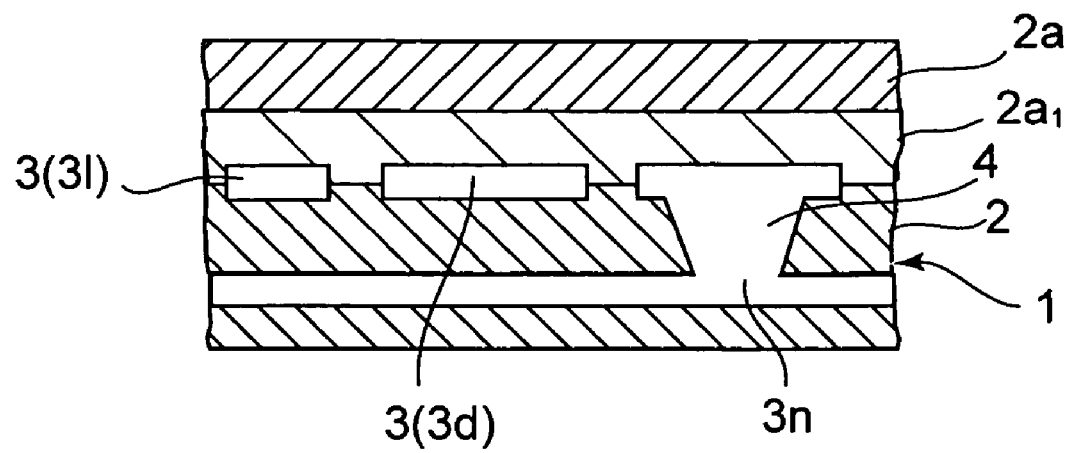
FIGS. 5A and 5B are diagrams for explaining a structure of another printed circuit board to which the invention is applicable.

The present invention will be explained below with reference to the drawings.

FIGS. 1A through 1H are diagrams for explaining a procedure for fabricating a multi-layered printed circuit board 1 of the invention. FIG. 1A is a section view of a main part of the printed circuit board 1 that becomes a base (core member) and FIGS. 1B through 1H are section views sequentially explaining the fabrication steps in order.

As shown in FIG. 1A, the printed circuit board 1 is composed of an insulator 2, a conductor pattern 3 formed by a conductive material, a conductor pattern $3n$ of an inner layer and a pattern connecting section 4 formed by the conductor for connecting the conductor pattern 3 with the conductor pattern $3n$. The conductor pattern 3 is composed of a so-called circular land portion $3d$ and a line portion $3l$ connecting between the land portions $3d$. It is noted that the printed circuit board 1 is what is fabricated on the basis of the invention and part of the conductor pattern 3 projects out of the insulator 2.

(Step 1) As shown in FIG. 1B, another insulator $2a$ is laminated on the surface of the printed circuit board 1. A material used for the insulating layer $2a$ is what is suitable for forming a fine pattern whose line width is 10 μm or less and whose spacing is around 10 μm, i.e., thermosetting resin such as epoxy resin, polyimide resin or phenol resin. The insulating layer $2a$ may be laminated by laminating a film-like insulator or by applying and hardening a liquid material. The laminated insulator here is called as the insulating layer $2a$ in order to distinguish the laminated insulator $2a$ from the insulator 2 that is the base material of the printed circuit board 1. Here, the insulating layer $2a$ is laminated to a thickness of 15 μm.

(Step 2) As shown in FIG. 1C, a resist layer 5 is formed by laminating a resist on the surface of the printed circuit board 1, i.e., on the surface of the insulating layer $2a$, having the conductive layer of the land portion $3d$, the line portion $3l$, the conductor pattern $3n$ and the pattern connecting section 4, i.e., the inner layer, and the insulating layer $2a$ on the surface thereof. It is noted that the resist to be laminated is preferable to be a positive-type resist whose solubility of exposed part to developing solution is large. The resist may be laminated by laminating a film-like resist or by applying and hardening a liquid material. It is noted that dipping may be adopted in case of laminating the liquid resist to a thickness of 3 μm and a spin coating or a capillary coating may be adopted in case of laminating it to a thickness of 3 μm or less. Here, the resist is laminated to a thickness of 3 μm. It is noted that the printed circuit board 1 on which the resist layer 5 is formed is also called as the printed circuit board 1. The step 2 corresponds to a "resist layer forming step" of the invention.

(Step 3) A hole 6 reaching to the conductor layer of the inner layer from the surface of the resist layer 5 is formed by irradiating a first laser beam from the side of the surface of the resist layer 5 to first position set in advance. That is, the hole 6 reaching to the land portion $3d$ from the surface of the resist layer 5 is made by the first laser beam as shown in FIG. 1D. That is, after positioning an optical axis of a laser beam whose section is shaped into a circular shape to a center of the land portion $3d$ to be processed, a pulse-like laser beam is irradiated as the first laser beam as indicated by an arrow A in the figure. It is preferable to select work conditions that allow the hole 6 to be shaped such that a value of an inner diameter of a bottom of the hole 6 is close to an inner diameter of an entrance of the hole 6.

In case of forming the hole 6 having a diameter of 50 μm by using a $CO_2$ laser as the first laser as a concrete example, the bottom may be formed so as to have a diameter of around 40 μm by irradiating two pulses of laser pulse having a wavelength of 9.4 μm, energy density of 10 to 15 $J/cm^2$ and a pulse width of 10 μs. When a UV laser having a wavelength of 355 nm is used as the first laser, the hole may be made by irradiating about 30 pulses of laser pulse having a pulse width of 20 ns by setting energy at a processing part to 0.8 $J/cm^2$. It is noted when the $CO_2$ laser is used as the laser, there is a case when resin residual 7 called as smear remains at the bottom of the hole 6. The step 3 corresponds to a "hole forming step" of the invention.

(Step 4) A second laser is irradiated to the first position and to a second position set in advance to form a hole 8 and grooves 9 having a depth not connected with the conductor layer of the inner layer, i.e., a depth corresponding to a conductor pattern to be formed, from the surface of the resist layer at the first and second positions. That is, the second laser whose beam is shaped into a rectangular (linear) shape is irradiated from the surface side of the resist layer 5 as indicated by arrows B in FIG. 1E to make hole 8 and the grooves 9 having the depth corresponding to the conductor pattern to be formed. The hole 8 is made so that it is linked with the entrance of the hole 6. It is noted that the hole 8 is a part where a land is to be formed and the grooves 9 are parts where lines are to be formed. These may be formed by scanning the laser on a mask described later after forming a laser transmitting section having the same pattern with the conductor pattern.

It is noted that although a specific optical system will be described later, they may be made so as to have a depth of 10 μm by irradiating about 10 pulses of excimer laser, as the second laser, having a wavelength of 308 nm and the like, a pulse width of 20 to 30 ns, energy density of the processing part of 1 $J/cm^2$ and a pulse repetition period of 50 Hz. It is also noted that even if the smear (resin residual 7) remains at the bottom as described in the step 3, it is possible to remove the smear by irradiating the excimer laser. The step 4 corresponds to a "recess forming step" of the invention. The "recess" of the present embodiment is a broad concept including the hole 8 and the grooves 9. The section of the second laser in a direction orthogonal to a center axis thereof is substantially a rectangle whose one side is fully larger than another side.

(Step 5) A conductor 10, i.e., a conductive material such as copper, is filled into the holes 6 and 8 and the grooves 9 by sputtering from above the resist layer 5. A deposition height of the conductor 10 may be 1 to 2 μm from the surface of the resist layer 5. Although there is a case when the conductor 10 above the holes 6 and 8 and the groove 9 dents in this case, it is practically no problem if a depth of the dents is 1 to 2 μm. The step 5 corresponds to a "conductor filling step" of the invention. FIG. 1F shows the section of the printed circuit board after the step 5.

(Step 6) Then, the conductor 10 is removed to the surface of the resist layer 5 by using a grinder R for example as shown in FIG. 1G. In this case, it is possible to efficiently grind the conductor 10 by monitoring the surface of the printed circuit board 1 by a detector (not shown). Specifically, because light reflectance of the resist is small, it is possible to judge that the surface of the resist layer 5 is exposed when the light reflectance drops below a threshold value set in advance by monitoring the light reflectance of the surface where no pattern is formed by a CCD camera (not shown) for example. Thereby, conductor patterns 12 and 11 are formed by the conductor 10 grinded (polished) after being filled into the holes 6 and 8 and the grooves 9.

(Step 7) The resist layer 5 is removed by a resist removing agent conventionally used as shown in FIG. 1H. Thus, the printed circuit board 1 in which the conductor patterns 12 and 11 formed in the step 6 project out of the insulating layer 2*a* is fabricated. The step 7 corresponds to a "resist layer removing step" of the invention.

It is possible to fabricate the printed circuit board 1 having a desirable number of layers by repeating the steps 1 through 7 described above.

As it will be understood from FIG. 1H, the portions of the land portion 3*d*, the line portion 3*l* and the pattern connecting section 4 projecting out of the insulator 2 (portions in a height direction) bite into (are buried into) the insulating layer 2*a* formed above them. Therefore, it is possible to increase strength for holding the insulator 2 and the insulating layer 2*a* together so as not to peel off (called as peel strength hereinafter) as compared to the prior art ones, thus improving reliability as a printed circuit board.

Furthermore, although the prior art technology, e.g., JP Application Laid-open No. 2006-41029, has required at least a photo-resist application step, a photo-resist curing step, an exposure step, a developing step, and a soft-etching step as processes for forming the grooves, a number of processing steps may be reduced by the present embodiment of the invention as compared to the prior art technology. Accordingly, it is possible to shorten a fabrication time and to reduce the fabrication cost.

It is noted that the present embodiment may be arranged so as to carry out the "hole forming step" of the step 3 and the "recess forming step" of the step 4 in an opposite sequence, i.e., so as to carry out the "hole forming step" of the step 3 after carrying out the "recess forming step" of the step 4. In this case, the second laser is irradiated at first to the first position and a predetermined second position to form the hole 8 and the grooves 9 (recess) having the depth not connected to the conductor layer of the inner layer from the surface of the resist layer 5 at the first and second positions. Then, the first laser is irradiated to the first position from the surface side of the resist layer 5 to form the hole 6 reaching to the conductor layer (e.g., the land portion 3*d*) of the inner layer from the surface of the resist layer 5. Then, the steps 5 through 7 described above are carried out in the same manner as described above. Such fabrication method brings about substantially the same effect with the embodiment described above.

It is noted that although the conductor 10 has been filled into the holes 6 and 8 and the grooves 9 by sputtering from the top of the resist layer 5 in the conductor filling step (Step 5) in the embodiment described above, the following modifications may be adopted instead of that.

<First Modification>

FIGS. 2A through 2H are diagrams for explaining a first modification in which the conductor filling step is modified. The steps shown in FIGS. 2A through 2E and the steps shown in FIGS. 2F through 2H are substantially the same with the steps shown in FIGS. 1A through 1H, respectively. The steps shown in FIGS. $2E_1$ and $2E_2$ are newly added in the first modification.

In the first modification, a mask 30 in which a hole 30*a* is formed in advance at position coaxial with the position of the hole 6 is prepared in advance. Then, after finishing the step 4 (the recess forming step) explained in FIG. 1E, the mask 30 is disposed on the upper face of the printed circuit board 1, i.e., the whole surface including the resist layer 5, the hole 8 and the grooves 9, and the conductor 10 is filled into the hole 6 by sputtering or vacuum deposition as shown in FIG. $2E_1$. Next, the mask 30 is removed at a point of time when a height of surface of the conductor 10 filled into the inside of the hole 6 reaches to the height of the hole 8 as shown in FIG. $2E_2$ and after that, the conductor filling step (sputtering or vacuum deposition) explained in connection with FIG. 1F is carried out to deposit the conductor 10 to the height of 1 to 2 μm from the surface of the resist layer 5. Then, the same processes with the step 6 in FIG. 1G and the step 7 in FIG. 1H are sequentially carried out.

<Second Modification>

FIGS. 3A through 3H are diagrams for explaining a second modification in which the conductor filling step is modified. The steps shown in FIGS. 3A through 3E and the steps shown in FIGS. 3F through 3H are substantially the same with the steps shown in FIGS. 1A through 1H, respectively. Steps shown in FIGS. $3E_1$ through $3E_3$ are newly added in the second modification.

While the second modification is the same with the first modification up to the steps shown in FIGS. $2E_1$ and $2E_2$, processes after that are different. That is, after the step in FIG. $3E_2$, plating catalyst such as palladium is applied to the surface of the printed circuit board 1, i.e., to the whole surface including the surface of the resist layer 5, the hole 8 and the grooves 9, by using a wet method. Successively, electroless plating is carried out to form a thin film layer T (dotted line in the figure) of the conductor as shown in FIG. $3E_3$. Then, the conductor 10 is deposited to the height of 1 to 2 μm from the surface of the resist layer 5 by plating. The plating may be carried out by normal electric plating. Or, it is possible to facilitate works of the step 6 shown in FIG. 3G by using a so-called field plating or reversible plating (a plating process of repeating plating and electrolysis by periodically changing polarity of voltage applied between an electrode not shown and the printed circuit board 1) that forms plating from the bottom of the hole because the surface of plating of the part where the holes 6 and 8 are formed is also substantially flattened.

<Third Modification>

FIGS. 4A through 4H are diagrams for explaining a third modification in which the conductor filling step is modified.

The steps shown in FIGS. 4A through 4E and the steps shown in FIGS. 4F through 4H are substantially the same with the steps shown in FIGS. 1A through 1H, respectively. The steps shown in FIG. 4E$_1$ is newly added in the third modification.

The mask 30 as explained in connection with FIG. 3 is not used in the third modification. That is, after finishing the step 4 (recess forming step) explained in connection with FIG. 1E, plating catalyst such as palladium is applied to the surface of the printed circuit board 1, i.e., to the whole exposed surface including the resist layer 5, the hole 8 and the grooves 9, by using a wet method. Then, the conductor 10 is deposited to the height of 1 to 2 µm from the surface of the resist layer 5 by plating (FIG. 4F) after forming a thin film layer T (dotted line in the figure) of the conductor by carrying out electroless plating or after forming the thin film layer T (the dotted line in the figure) of the conductor to a thickness of 1 µm or less on the whole surface of the printed circuit board 1, i.e., on the surface of the resist layer, the holes 6 and 8 and the grooves 9, by sputtering as shown in FIG. 4E$_1$. The plating may be carried out by normal electric plating or by reversible plating. It is noted that when the reversible plating is carried out, the thickness of the plating layer needs to be thicker than the case of the second modification.

By the way, although the material of the laminated insulator 2a has been thermosetting resin and the thickness of the laminate has been 15 µm for example as described above, the thickness of the laminate of the insulating layer 2a differs depending on its use. Normally, a single insulating material is used when the thickness of the insulating layer 2a is 40 µm or less. When the thickness is 40 µm or more on the other hand, a plurality of materials may be used for the insulating layer 2a.

Then, a structure of another printed circuit board to which the invention is applicable will be explained with reference to FIG. 5.

Figure 5B:
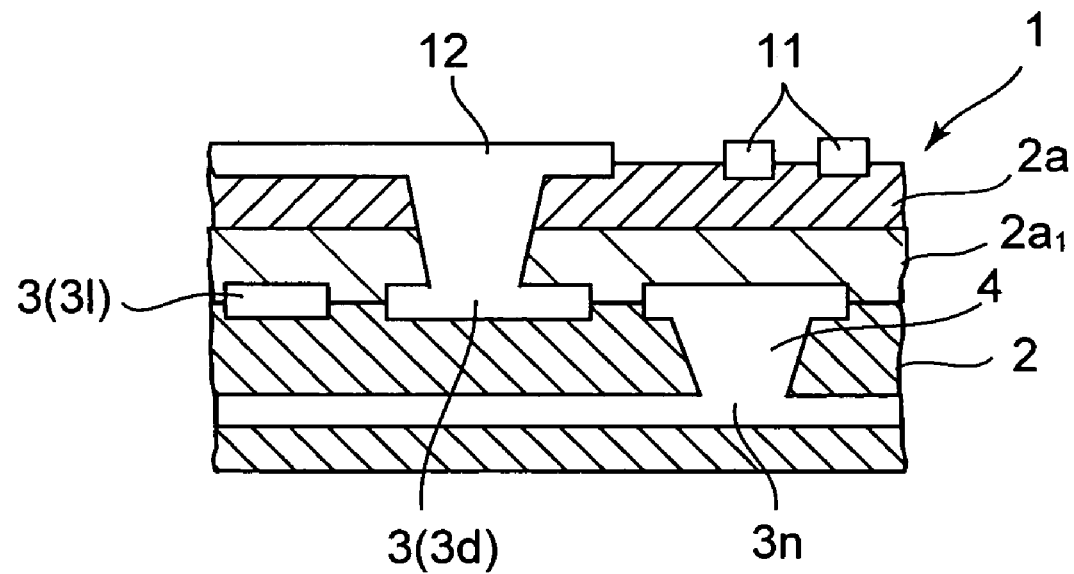

When the thickness of the laminate exceeds 40 µm as shown in FIG. 5A, an insulator having a two-layered structure for example is used and the thermosetting resin 2a is built up after laminating (building up) a glass fiber reinforced material 2a$_1$ e.g., FR-4 material, on the conductor layer (3l, 3d and others). Then, the conductor patterns 11 and 12 are formed as shown in FIG. 5B by the processes explained in FIGS. 1 through 4. It is noted that the FR-4 material is a flame resisting glass fiber reinforced epoxy.

Figure 6:
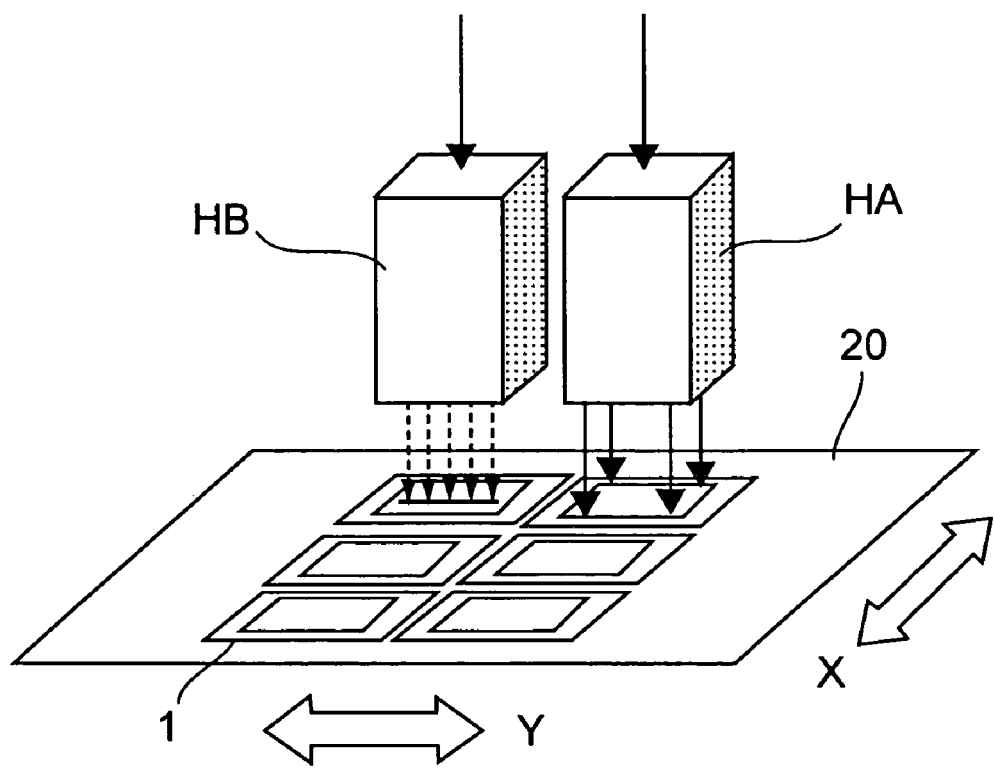
FIG. 6 is a perspective view showing a disposition of head sections of a printed circuit board machining apparatus suitable to the invention.

Next, a printed circuit board machining apparatus suitable for the invention will be explained. FIG. 6 is a perspective view showing a disposition of head sections of the printed circuit board machining apparatus suitable to the invention and FIGS. 7 and 8 are schematic structural views of the head sections (laser irradiating sections) of the printed circuit board machining apparatus.

The printed circuit board machining apparatus (not shown) is arranged so as to be able to irradiate a sectionally-circular beam and a sectionally-rectangular beam to the printed circuit board 1, i.e., a workpiece. Head sections HA and HB are fixed to a body (not shown) of the printed circuit board machining apparatus. A table 20 supporting the printed circuit board 1 is arranged so as to be movable in X- and Y-directions on the body while carrying the printed circuit board 1, i.e., the workpiece. A $CO_2$ laser oscillator (the laser oscillator outputting the first laser) not shown and an excimer laser oscillator (the laser oscillator outputting the second laser) are disposed on the body.

Figure 7:
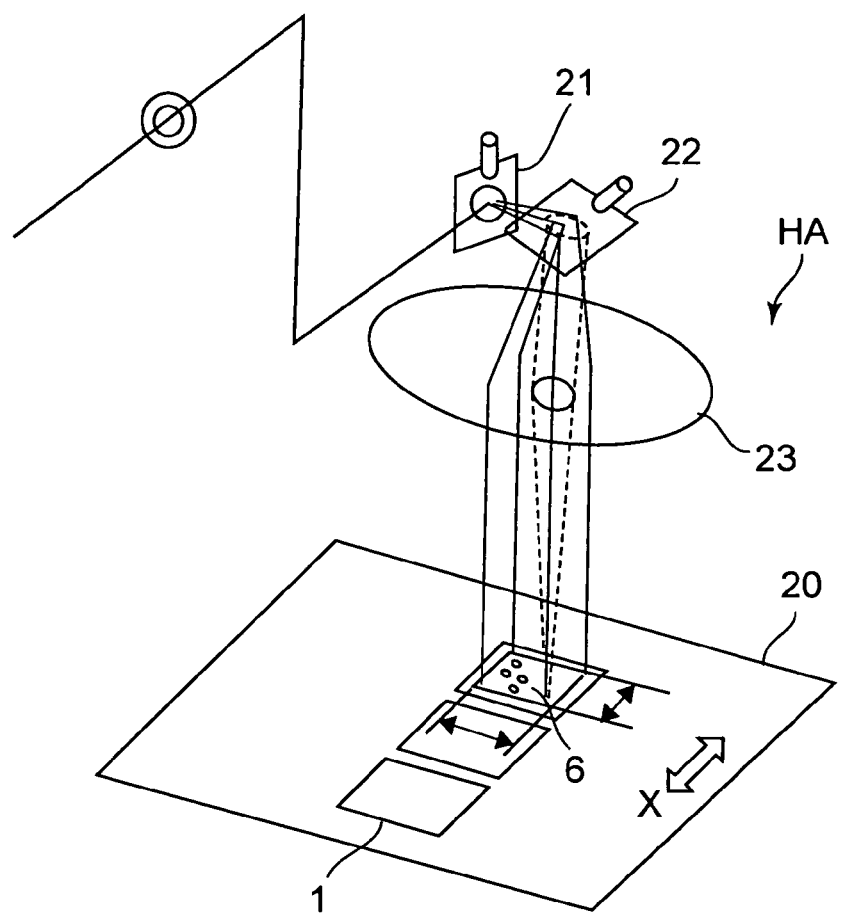
FIG. 7 is a perspective view for explaining the head section suitable to the invention.

A pair of optical mirrors 21 and 22 and an fθ lens (condenser lens) 23 are disposed in the head HA as shown in FIG. 7. Then, in case of making the hole 6 (Step 3 described above), a pulsed $CO_2$ laser beam (the first laser) outputted out of the $CO_2$ laser oscillator is shaped into a beam whose section is circular by an optical system (first optical system) not shown and is positioned in the X- and Y-directions by the optical mirrors 21 and 22 to make the hole 6 at desirable position. It is noted that the optical mirrors 21 and 22 make a positioning unit for positioning the sectionally-circular beam in the X- and Y-directions.

Figure 8:
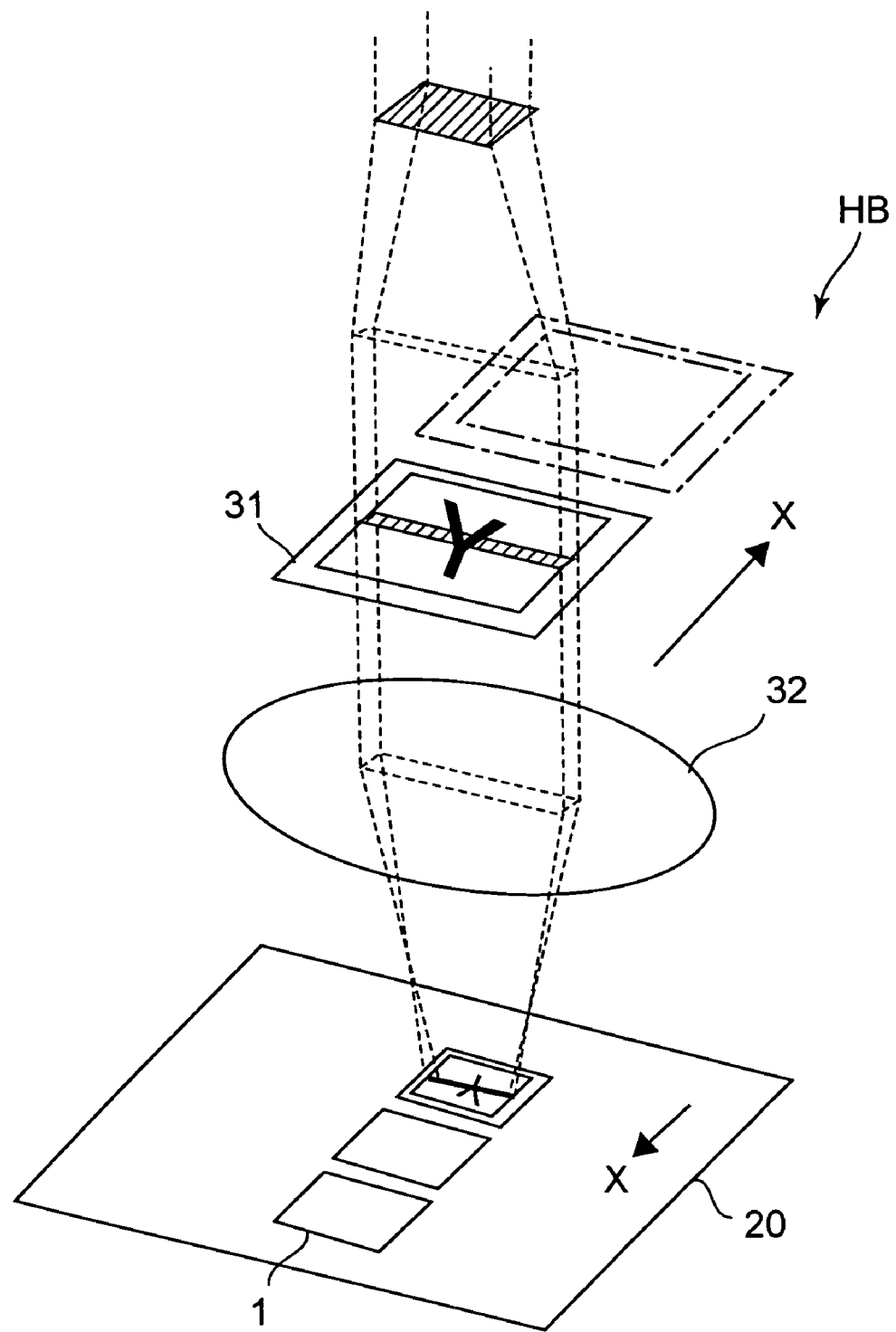
FIG. 8 is a perspective view for explaining the head section suitable to the invention.

In case of the head HB, a mask 31 is disposed in an optical path between the head HB and the table 20 in parallel with the mask 31 and the table 20 as shown in FIG. 8. The body is provided with a moving unit (not shown) for moving the mask 31 in a direction orthogonal to the optical path. The mask 31 is provided with a laser transmitting section having a pattern corresponding to a pattern to be disposed on the printed circuit board 1. A condenser lens 32 is disposed between the mask 31 and the table 20.

Then, in case of making the hole 8 and the grooves 9 (the step 4 described above), the square excimer laser (the second laser) outputted pulse-wise from the excimer laser oscillator is converted (shaped) into a rectangular beam (called as a "line beam" hereinafter) whose distribution of intensity is homogeneous by a homogenizer (a beam intensity distribution shaping unit: second optical system) not shown and is incident on the mask 31 disposed on the optical path of the sectionally-rectangular beam. Then, the line beam transmitted through the mask 31 is condensed by the condenser lens 32 and forms an image of the laser transmitting section on the surface of the resist layer 5 laminated on the surface of the printed circuit board 1 to make the hole 8 and the grooves 9. When the mask 31 and the table 20 are moved in opposite directions from each other as indicated by arrows in FIG. 8, the line beam scans the mask 31, so that the desirable hole 8 and the grooves 9 may be made on the surface of the printed circuit board 1. It is noted that in this case, a moving speed of the table 20 with respect to the mask 31 is equalized with a rate of reduction.

It is noted that the conductor pattern may be drawn by using a UV laser having a wavelength of 400 nm or less as the second laser instead of the excimer laser and by shaping the beam into a circular beam.

The invention claimed is:

1. A method for fabricating a printed circuit board, the method comprising:
    a resist layer forming operation of forming a resist layer on a surface of a printed circuit board, the printed circuit board having a conductor layer as an inner layer and the surface of the printed circuit board being an insulating layer;
    a hole forming operation of forming a hole reaching to the conductor layer from the surface of the resist layer at a first position set in advance by irradiating a first laser beam from a surface side of the resist layer;
    a recess forming operation of forming recesses having a depth not connected to the conductor layer from a surface of the resist layer at a second position set in advance by irradiating a second laser beam to the first and second positions;
    a conductor filling operation of forming a conductor pattern by filling a conductive material into the hole and the recesses; and
    a resist layer removing operation of removing the resist layer such that portions of the conductor pattern project out of the surface of the insulating layer.

2. A method for fabricating a printed circuit board, the method comprising:
    a resist layer forming operation of forming a resist layer on a surface of a printed circuit board, the printed circuit board having a conductor layer as an inner layer and the surface of the printed circuit board being an insulating layer;

a recess forming operation of forming recesses having a depth not connected to the conductor layer from a surface of the resist layer at a first position and a second position set in advance by irradiating a second laser beam to the first and second positions;

a hole forming operation of forming a hole reaching to the conductor layer from the surface of the resist layer at the first position by irradiating a first laser beam or the second laser beam from a surface side of the resist layer;

a conductor filling operation of forming a conductor pattern by filling a conductive material into the hole and the recesses; and a resist layer removing operation of removing the resist layer such that portions of the conductor pattern project out of the surface of the insulating layer.

3. The method of claim 2, further comprising:
removing conductive material existing above the surface of the resist layer after disposing the conductive material in the hole, in the recesses, and on the surface of the resist layer in filling the conductive material in said conductor filling operation.

4. The method of claim 2, wherein the conductive material is filled into the hole and the recesses in said conductor filling operation by sputtering.

5. The method of claim 2, wherein
the conductive material is filled into the hole and the recesses in said conductor filling operation by plating; and
a conductor of 1 μm or less thick is disposed on the surface of the hole and the recesses prior to plating.

6. The method of claim 2, wherein the second laser beam is generated by an excimer laser device.

7. The method of claim 2, wherein the first laser beam is generated by a $CO_2$ laser device or a UV laser device and has a wavelength of 400 nm or less.

8. The method of claim 2, wherein a cross section of the second laser beam orthogonal to a center axis thereof is substantially rectangular and has one side larger than another side.

9. The method of claim 1, further comprising:
removing conductive material existing above the surface of the resist layer after disposing the conductive material in the hole, in the recesses, and on the surface of the resist layer in filling the conductive material in said conductor filling operation.

10. The method of claim 1, wherein the conductive material is filled into the hole and the recesses in said conductor filling operation by sputtering.

11. The method of claim 1, wherein
the conductive material is filled into the hole and the recesses in said conductor filling operation by plating; and
a conductor of 1 μm or less thick is disposed on the surface of the hole and the recesses prior to plating.

12. The method of claim 1, wherein the second laser beam is generated by an excimer laser device.

13. The method of claim 1, wherein the first laser beam is generated by a $CO_2$ laser device or a UV laser device and has a wavelength of 400 nm or less.

14. The method of claim 1, wherein a cross section of the second laser beam orthogonal to a center axis thereof is substantially rectangular and has one side larger than another side.

* * * * *